United States Patent [19]
Nakaba

[11] Patent Number: 5,723,964
[45] Date of Patent: Mar. 3, 1998

[54] METHOD AND DEVICE FOR CONTROLLING STEP MOTOR

[75] Inventor: Hiroaki Nakaba, Ciryu, Japan

[73] Assignee: Nippondenso Co., Ltd., Kariya, Japan

[21] Appl. No.: 593,077

[22] Filed: Jan. 29, 1996

[30] Foreign Application Priority Data

Feb. 15, 1995 [JP] Japan ................................ 7-027008
Nov. 21, 1995 [JP] Japan ................................ 7-302971

[51] Int. Cl.⁶ .......................................... G01R 11/36
[52] U.S. Cl. .................... 318/599; 318/696; 324/160; 73/2; 364/569
[58] Field of Search ........................... 318/567, 569, 318/599–605, 685, 696; 324/160–163, 166–168; 73/2, 490, 506, 507, 530, 531; 235/95 R, 96; 364/569; 377/20, 24, 24.1, 24.2

[56] References Cited

U.S. PATENT DOCUMENTS

| | | | |
|---|---|---|---|
| 4,144,573 | 3/1979 | Trussell et al. | 364/506 |
| 4,710,818 | 12/1987 | Inatsuki | 358/214 |
| 5,017,861 | 5/1991 | Hukuda | 324/143 |
| 5,138,639 | 8/1992 | Nakamura | 377/17 |
| 5,315,536 | 5/1994 | Murase et al. | 364/569 |
| 5,446,655 | 8/1995 | Fukuda et al. | 364/424.01 |

FOREIGN PATENT DOCUMENTS

| | | |
|---|---|---|
| 60-98897 | 6/1985 | Japan. |
| 60-141194 | 7/1985 | Japan. |
| 64-6556 | 1/1989 | Japan. |
| 1-223312 | 9/1989 | Japan. |
| 5-59991 | 3/1993 | Japan. |
| 5-344795 | 12/1993 | Japan. |
| 6-180323 | 6/1994 | Japan. |
| 2 164152 | 3/1986 | United Kingdom. |
| 2 270 567 | 3/1994 | United Kingdom. |
| 93/20346 | 10/1993 | WIPO. |

*Primary Examiner*—Brian Sircus
*Attorney, Agent, or Firm*—Cushman Darby & Cushman IP Group of Pillsbury Madison & Sutro LLP

[57] ABSTRACT

A CPU measures pulse width of a vehicle speed pulse signal transmitted from a vehicle speed sensor continuously and estimates the pulse width coming next according to the pulse width of the present pulse and preceding pulses. The CPU calculates a set position of a stepping motor from the data of the pulse width and the estimated pulse width, and calculates the number of steps for the stepping motor to move to the set position from the set position data and the present position data. Each driving time of the stepping motor is calculated from the estimated pulse width data and the number of steps.

9 Claims, 4 Drawing Sheets

FIG. 5A
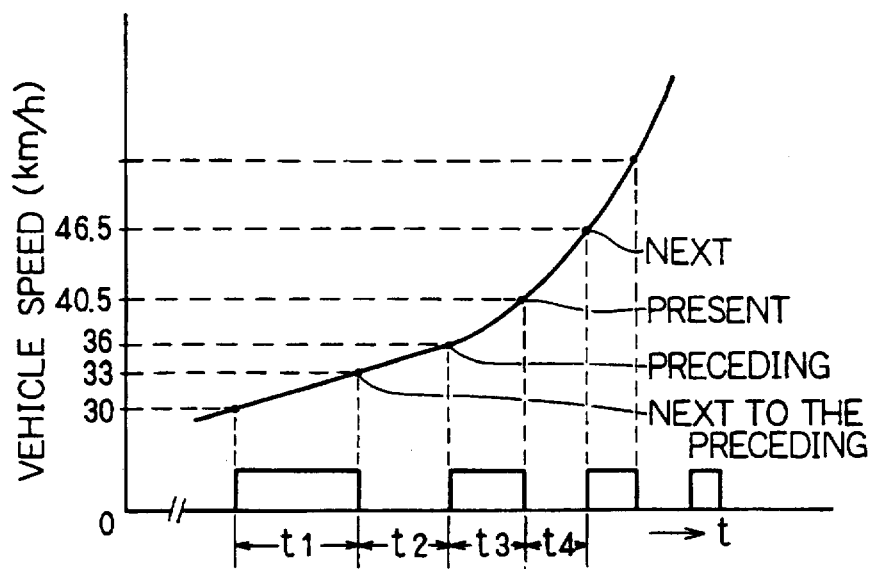
FIG. 5B
FIG. 5C
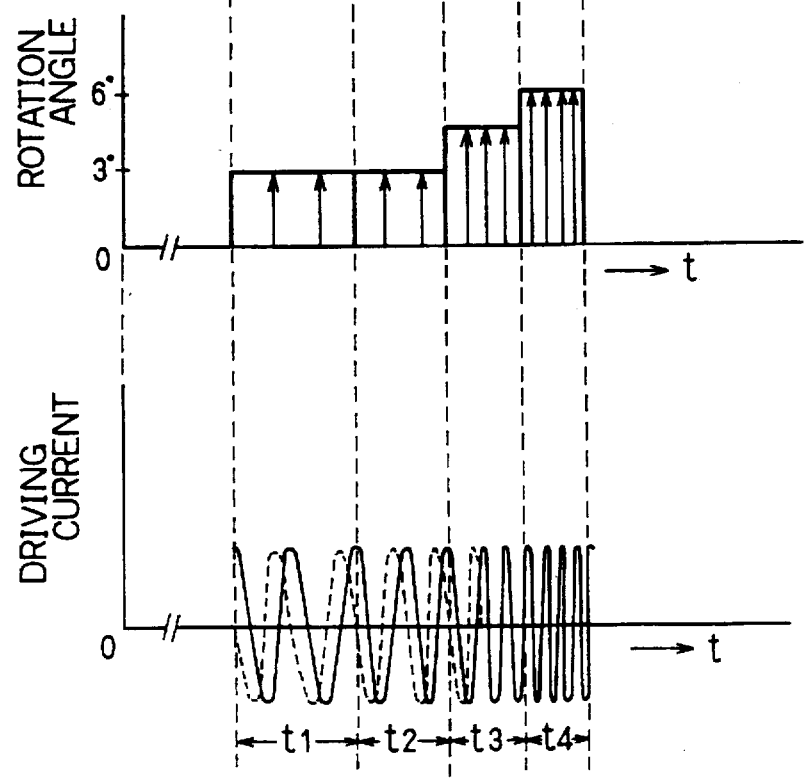

METHOD AND DEVICE FOR CONTROLLING STEP MOTOR

CROSS REFERENCE TO RELATED APPLICATION

The present application is based on and claims priority from Japanese Patent Applications Hei 7-27008, filed on Feb. 15, 1995 and Hei 7-302971, filed on Nov. 21, 1995, the contents of which are incorporated herein by reference.

BACKGROUND OF THE INVENTION

1. Field of the invention

The present invention relates to a method and a device for controlling a stepping motor used for a vehicle indicator instrument or a throttle valve controlling system.

2. Description of Related Art

Stepping motors have been used to drive speedometers and tachometers for vehicles. For instance, Japanese Utility Model Unexamined Publication Sho 64-6556 proposes a indicating instrument driven by a stepping motor to be installed in a speedometer or a tachometer for a vehicle. When the stepping motor of the indicating instrument disclosed in the above publication rotates an indicator in response to pulse signals representing vehicle speed or the like, the frequency of the pulse signal is modulated with the number of rotational steps of the stepping motor in a fixed period T to equalize the driving time of the stepping motor, thereby smoothing the indicator's rotation.

However, in the above conventional indicator instrument, since the stepping motor is driven according to the number of the rotational steps in a fixed period T, the number of rotational steps is only calculated each fixed period even when many pulses are applied to the stepping motor in case of quick acceleration or the like. If change in the vehicle speed in the period T is significant, the indicator cannot indicate accurate vehicle speed timely. The longer the period T becomes, the more the indicator delays.

In addition, if the vehicle speed changes very slowly and interval between two pulses of the driving pulse signal becomes longer than the period T, the driving pulse is not applied to the stepping motor at one time and is applied thereto at another time. As a result, the indicator stands still at one time and rotates at another time, resulting in awkward motion of the indicator.

SUMMARY OF THE INVENTION

In view of the above described circumstances, it is a primary object of the present invention to provide a method and a device for driving a stepping motor so that the stepping motor can rotate smoothly in response to pulse width of a driving pulse signal applied to the stepping motor without delay even when the cycle period of the driving pulse signal changes quickly.

Another object of the present invention is to provide a method for controlling a stepping motor. Whereby, when a pulse signal is applied to the device, pulse width of the pulse signal is continuously detected and the next pulse width is estimated by calculating from the present pulse width and the preceding pulse width in synchronism with the pulse signal in order to calculate a set position or set number of moving steps of the stepping motor. Then, driving time for each moving step of the stepping motor is calculated in synchronism with the pulse signal from said next pulse width and said set number of steps. Since the stepping motor is driven according to the estimated pulse width and prearranged drive timing, the stepping motor can be driven smoothly without delay.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

FIG. 5A is a graph showing relationship between a pulse signal and vehicle speed;

FIG. 5B is a graph showing relationship between the number of pulses and rotational angles of an indicator; and FIG. 5C is a graph showing a wave form of driving current of a stepping motor.

DETAILED DESCRIPTION OF THE PREFERRED EMBODIMENT

Preferred embodiments will be described with reference to appended drawings hereafter.

Figure 1:
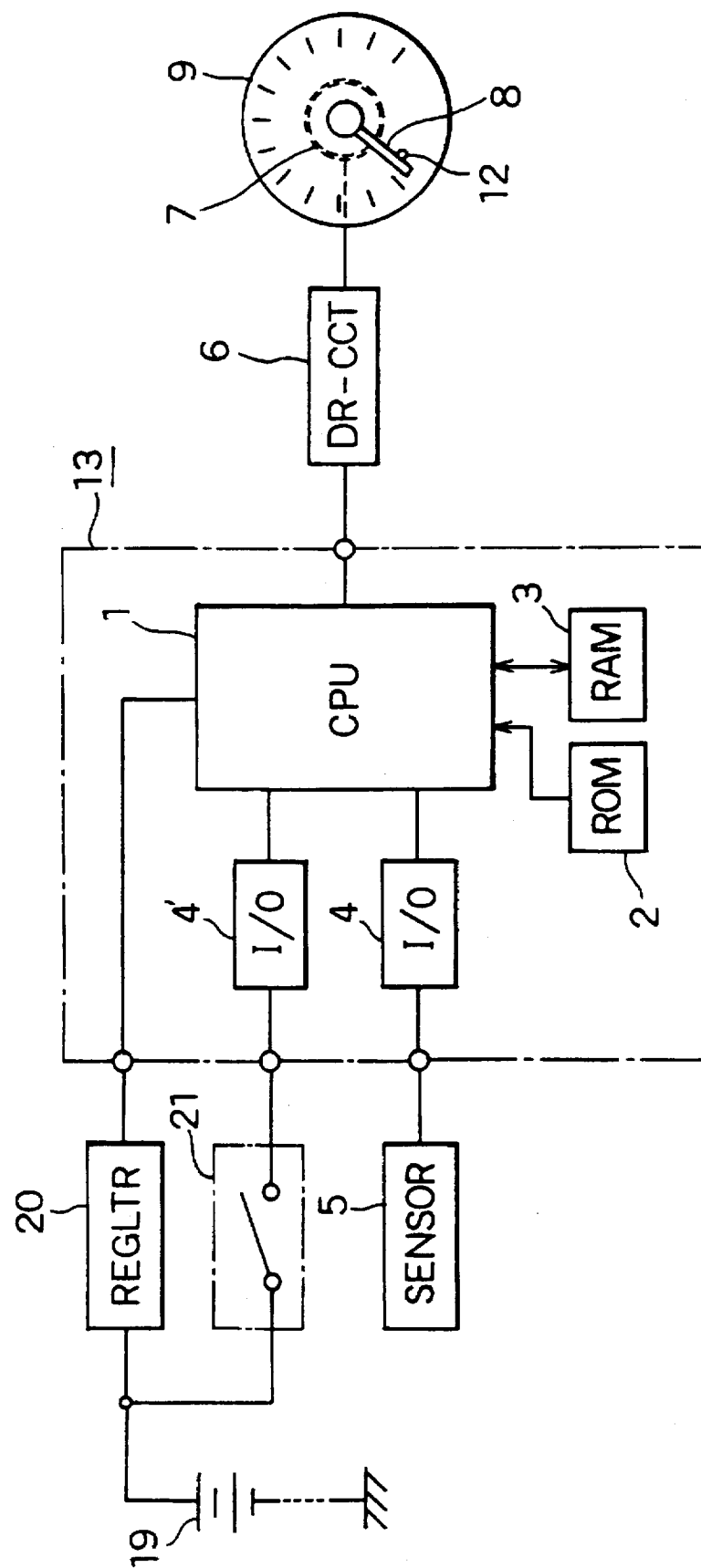
FIG. 1 is a block diagram of a speedometer control device according to a preferred embodiment of the present invention.
Figure 2:
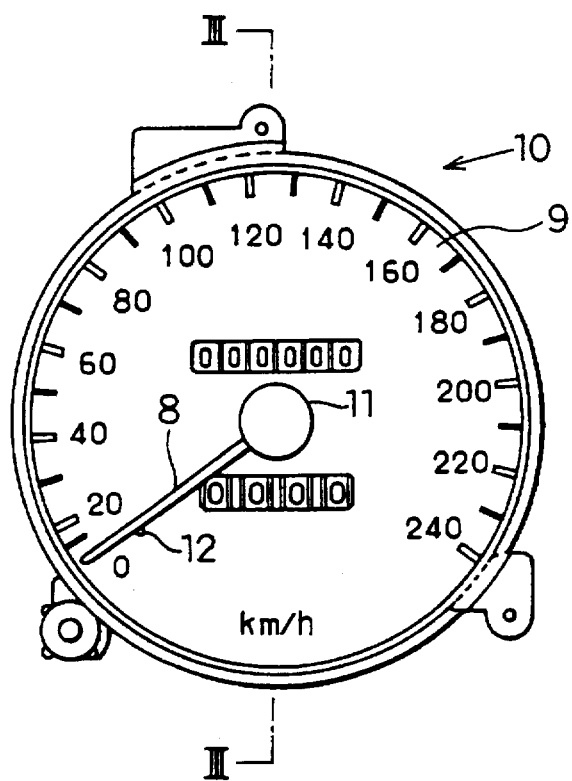
FIG. 2 is a front view illustrating a speedometer for a vehicle.
Figure 3:
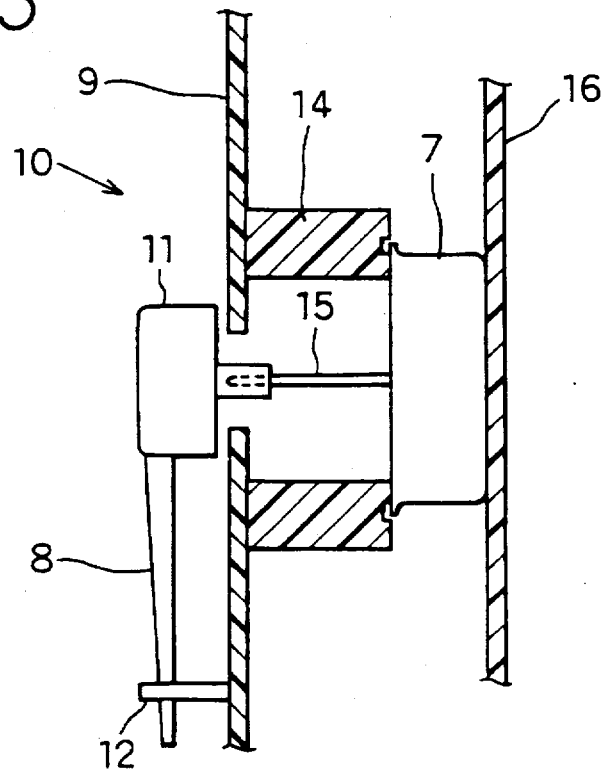
FIG. 3 is an enlarged cross-sectional side view illustrating a portion of the speedometer cut along lines III—III in FIG. 2.

In FIG. 1, a drive control device is mainly composed of a microcomputer 13 which includes a CPU 1, a ROM 2, a RAM 3 and I/O (input-output) circuits 4 and 4'. The CPU 1 is connected to a battery 19 through a voltage regulator 20, to a vehicle-speed sensor 5 through the I/O circuit 4 and to an ignition coil 21 through the I/O circuit 4'. The ignition coil 21 sends an on-signal to the CPU 1 when the ignition coil is energized. The vehicle-speed sensor 5, which is a well-known signal generator used for a speedometer and/or an automatic torque transmission system, generates a vehicle-speed signal which has pulse width corresponding to the vehicle speed, and sends the pulse signal to the I/O circuit 4. The CPU 1 is also connected to a stepping motor 7 through a drive circuit 6. The stepping motor 7 is fixed as a movement of the indicator instrument to a board 16 which is disposed inside a speedometer 10. A dial plate 9 is fixed in front of the stepping motor 7 via a connecting member 14 as shown in FIG. 2 and FIG. 3. The dial plate 9 has a center hole, in which a rotating shaft 15 of the stepping motor 7 is inserted to carry a indicator holder 11 of the indicator 8 at an end thereof. A stopper 12 is disposed at a zero position on the dial plate 9.

The CPU 1 measures pulse width of the vehicle speed signal, calculates the number of moving steps of the stepping motor 7 to move from a present rotational position to a set rotational position on the basis of programs stored in the ROM 2 beforehand. The RAM 3 has a plurality of areas for storing data such as a pulse width area for storing data of the pulse width of the vehicle speed signal in the receiving order, a position area for storing data of motor-rotational position (or indicator position) which corresponds to the stored pulse width, a next pulse width area for storing data of estimated pulse width, an estimated position area for storing data of the next position, a set-position area for storing data of the set-position of the stepping motor 7 or the indicator 8 and a present position area for storing data of the current position data of the stepping motor 7.

Figure 4:
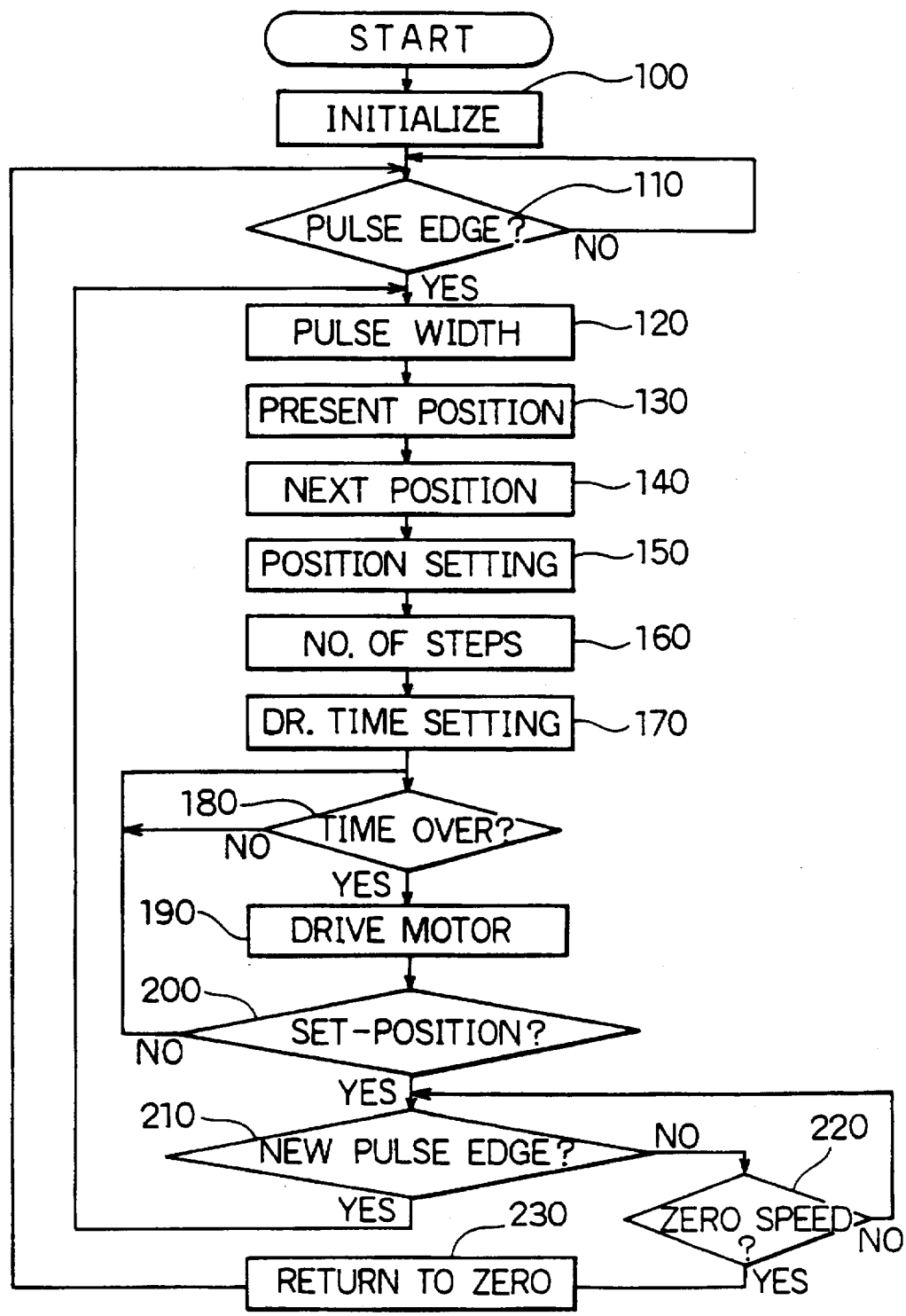
FIG. 4 is a flow chart showing operation of the control device according to the preferred embodiment of the present invention.

Operation of the drive control device according to the above preferred embodiment is described next with reference to a flow chart shown in FIG. 4 and graphs shown in FIGS. 5A, 5B and 5C.

When the CPU 1 is switched on, a step 100 is executed to initialize respective registers, the RAM 3 and others. Then, the CPU 1 checks whether a pulse edge exists or not in the vehicle speed signal transmitted from the vehicle speed sensor 5. If the pulse edge exists, the CPU 1 proceeds to the next step 120, where pulse width or time period between the preceding pulse edge and the present pulse edge is measured and stored as one of data in the RAM 3.

For example, the measured time or pulse width to be stored into the pulse width area of the RAM 3 is t3 as shown in FIG. 5A. The pulse width area also stores the preceding pulse width t2 and the pulse width t1 next to the preceding pulse width t2 in the time order, and the data is renewed and stored each time a new pulse edge is detected. Four pulse-width data (t1 through t4) are stored in this embodiment, however, any number of data can be stored.

Then, the CPU 1 calculates a set position (set number of moving steps) of the indicator 8 or the stepping motor 7 on the basis of the pulse-width data t3 and stores the set position into the set position area of the RAM 3. The preceding pulse width data t2 and the data t1 next to the preceding data are also stored in the position area.

An estimated or next pulse width t4 is calculated from the following equation in a step 140:

$$t4 = t2 - (t1 - t3)/2$$

That is, the next pulse width t4 is calculated from the preceding pulse width t2 and a half of a difference between the pulse width t1 and the pulse width t3. The position-data or the number of steps of the stepping motor 7 is calculated from the next pulse width t4 and stored into the estimated position area of the RAM 3.

A set position of the indicator 8 or set number of the steps of the stepping motor 7 is calculated from the estimated position data in a step 150. That is, a set position (or set number of the steps) of the stepping motor 7 is calculated from the mean value of the four position data corresponding to the data of the stored pulse width t1, t2 and t3 and the estimated data t4.

Then, a present position data (the number of steps from zero position to the present position), which is stored in the present position area of the RAM 3, is subtracted from the above set position, thereby to obtain the number of moving steps for the stepping motor to move in a step 160.

The CPU 1 then calculates a driving time period of each step from the following equation:

driving time period = estimated pulse width t4÷the present number of steps×a coefficient of delay where the coefficient of delay is a real number larger than 1. The coefficient of delay prevents a standstill of the indicator by multiplying the number larger than 1 to the pulse width t4 when a pulse of the vehicle speed signal is applied later than estimated time. The indicator may stand still otherwise at an estimated position. The CPU 1 counts a time clock in a step 180 until the driving time calculated in the step 170 is over. Then, the CPU 1 proceeds to a step 190 and supplies the drive circuit 6 with driving current shown in FIG. 5C to drive the stepping motor 7 to one step. The present position data is renewed in this step and stored into the present position area of the RAM 3.

The CPU 1 determines whether the present rotational position of the stepping motor 7 is located at the set position or not in a step 200. If the present position is not located at the set position, the program returns to the step 180.

Thus, the stepping motor 7 is driven by one step, which corresponds to an angle of 1.5° or 1.5 km/h for example, as each of the driving time passes until the present position comes to the set position.

If the vehicle speed changes from 33 km/h to 36 km/h between time next to the preceding time and the preceding time and from 36 km/h to 40.5 km/h between the preceding time and the present time, the stepping motor is driven by two steps during the time period t2, and is driven by three steps during the time period t3 as shown in FIGS. 5A and 5B. Thus, if the vehicle speed changes from 40.5 km/h to 46.5 km/h during the time period t3, the stepping motor 7 is driven by four steps. FIG. 5B shows a relationship between the rotation angle of the stepping motor 7 and the number of pulses applied to the stepping motor 7. FIG. 5C shows a wave form of the driving current of the stepping motor 7. It is noted that the frequency changes with the number of pulses of the vehicle speed signal or the number of the moving steps. That is, the stepping motor is driven by AC current whose cycle is modulated according to the number of the pulses or moving steps.

When the present position comes to the set position in the step 200, the CPU 1 proceeds to a step 210, where whether the pulse edge of a new vehicle speed signal exists or not is checked. If the pulse edge is found, the CPU 1 returns to the step 120 and the following steps described before are executed to calculate a new set position and a new driving time according to a new estimated pulse width t4 and a set number of the moving steps. If the pulse edge is not found during the fixed time period, the CPU 1 proceeds from the step 210 to a step 220 and the vehicle speed is determined to be zero. If the vehicle speed is determined to be zero, the next step 230 follows and the stepping motor 7 is returned to the zero position, thereby returning the indicator to the zero position.

Thus, the driving time for one step of the stepping motor is calculated from the estimated position data which is calculated from the pulse width data of preceding time, next to the preceding time and the present time so that the indicator can be located at an estimated or next position at an estimated time. As a result, when the next vehicle speed pulse signal is applied from the vehicle speed sensor 5, the stepping motor 7 can move to the rotational position corresponding to the calculated pulse width without standstill of the indicator 8.

The stepping motor 7 is driven by one step for one pulse in synchronism with the vehicle speed signal during the driving time which is determined according to the number of steps in each pulse width of the vehicle speed signal so that the indicator can rotate without standstill, thereby improving response time of the indicator even when the cycle time of the vehicle speed signal changes.

The estimated pulse width t4 is calculated according to three data of the pulse width t1, t2 and t3 in the above embodiment, however it can be obtained from two data of the pulse width t2 and t3 by the following equation:

$$t4 = t2 \times t3/(2\, t2 - t3)$$

Since t4 is calculated from two pulse width data, the calculation time is reduced.

The driving time can be calculated from the present pulse width t3 without other preceding data. For example, after the number of steps corresponding to the pulse width t3 is calculated, each driving time for each step is obtained by dividing the pulse width t3 by the number of steps. Although the driving time is not so accurate as that obtained from the above calculations, the driving time for one step of the stepping motor 7 can be controlled according to the pulse width of the vehicle speed pulse signal, and the number and time period of the standstill can be reduced.

The embodiment according to the present invention can be used for an engine throttle control system, in which a set position of the throttle valve is calculated and the number of steps and driving time of the stepping motor are calculated from data of the present position and the set position to control a stepping motor according to accelerator pedal operation. As a result, the throttle valve can be controlled accurately and smoothly.

Although the present invention has been fully described in connection with the preferred embodiment thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A method for controlling a stepping motor which rotates a motor shaft according to pulse width of an outside signal, said stepping motor comprising steps of:

detecting continuously present pulse width of said outside signal;

calculating, in synchronism with said outside signal, next pulse width from said present pulse width;

calculating a set position where said motor shaft moves from said present pulse width and said next pulse width;

calculating present position from said present pulse width;

calculating, in synchronism with said outside signal, number of moving steps of said motor shaft from said present position and said set position;

calculating driving time of each step of said motor shaft from said next pulse width and said number of moving steps; and driving said motor shaft according to said driving time and said number of moving steps.

2. A method for controlling a stepping motor as claimed in claim 1, wherein said step of calculating said next pulse width comprises a step of calculating said next pulse width t4 on the basis of the following equation:

$$t4 = t2 - (t1 - t3)/2$$

where t3 is a present pulse width, t2 is a preceding pulse width and t1 is a pulse width next to said preceding pulse width.

3. A method for controlling a stepping motor as claimed in claim 2, wherein said step of calculating said next pulse width comprises a step of multiplying said pulse width t4 by a coefficient larger than 1.

4. A method for controlling a stepping motor (7) as claimed in claim 1, wherein said step of calculating said next pulse width comprises a step of calculating said next pulse width t4 on the basis of the following equation:

$$t4 = t2 \times t3/(2\,t2 - t3)$$

where t3 is a present pulse width, t2 is a preceding pulse width and t1 is a pulse width next to said preceding pulse width.

5. A method for controlling a stepping motor as claimed in claim 4, wherein said step of calculating said next pulse width comprises a step of multiplying said pulse width t4 by a coefficient larger than 1.

6. A method for controlling a stepping motor as claimed in claims 1, wherein said step of calculating said next pulse width comprises a step of multiplying a pulse width obtained on the basis of said present pulse width, a preceding pulse width and a pulse width next to said preceding pulse width by a coefficient larger than 1.

7. A device for controlling a stepping motor which rotates a motor shaft according to pulse width of an outside signal, said stepping motor comprising:

means for detecting pulse width of said outside signal;

means for storing a plurality of said pulse width as data in time order;

means for calculating next pulse width of said outside signal from stored data of said pulse width;

means for calculating present position data from said stored data of said pulse width;

means for calculating, in synchronism with said outside signal, number of moving steps of said motor shaft during said next pulse width from said present position data and said next pulse width;

means for calculating driving time of each moving step of said motor shaft from said next pulse width and said number of steps so as to drive said motor shaft at an equal interval; and means for driving said motor shaft according to said driving time and said number of steps.

8. A device for controlling a stepping motor as claimed in claim 7, wherein said next pulse width calculating means comprises means for approximating said stored data of said pulse width into a linear function and means for calculating said next pulse width on the basis of said linear function.

9. A device for controlling a stepping motor which rotates a motor shaft, said stepping motor comprising a control unit for controlling said motor shaft according to steps of:

measuring continuously pulse width of an outside signal;

calculating, in synchronism with said outside signal, number of steps for said motor shaft to rotate to an angle corresponding to said pulse width from said measured pulse width;

calculating driving time of each step of said motor shaft from said number of steps; and driving said motor shaft according to said driving time.

* * * * *